US012604738B2

(12) United States Patent

La Tulipe

(10) Patent No.: US 12,604,738 B2

(45) Date of Patent: Apr. 14, 2026

(54) SYSTEMS AND METHODS FOR PROVIDING DYNAMIC SECURITY FABRIC INTERPOSERS IN HETEROGENEOUSLY INTEGRATED SYSTEMS

(71) Applicant: The Charles Stark Draper Laboratory, Inc., Cambridge, MA (US)

(72) Inventor: Douglas La Tulipe, Cambridge, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 331 days.

(21) Appl. No.: 18/227,451

(22) Filed: Jul. 28, 2023

(65) Prior Publication Data

US 2025/0038132 A1 Jan. 30, 2025

(51) Int. Cl.
| | |
|---|---|
| *H10W 42/40* | (2026.01) |
| *H10W 70/60* | (2026.01) |
| *H10W 70/65* | (2026.01) |
| *H10W 70/685* | (2026.01) |
| *H10W 90/00* | (2026.01) |
| *H10B 80/00* | (2023.01) |

(52) U.S. Cl.
CPC ......... *H10W 42/405* (2026.01); *H10W 42/40* (2026.01); *H10W 70/611* (2026.01); *H10W 70/65* (2026.01); *H10W 70/685* (2026.01);

*H10W 90/00* (2026.01); *H10B 80/00* (2023.02); *H10W 90/722* (2026.01); *H10W 90/724* (2026.01)

(58) Field of Classification Search
None
See application file for complete search history.

(56) References Cited

U.S. PATENT DOCUMENTS

| | | | |
|---|---|---|---|
| 2021/0342169 A1* | 11/2021 | Heinrich | ............. G06F 9/45508 |
| 2023/0095162 A1* | 3/2023 | Seidemann | ......... H01L 25/0655 257/399 |

* cited by examiner

*Primary Examiner* — Nicholas J Tobergte

(74) *Attorney, Agent, or Firm* — Young Basile Hanlon & MacFarlane, P.C.

(57) ABSTRACT

A system may include an integrated circuit (IC) package. The IC package may include one or more IC die hosting one or more circuits, and an interposer. The interposer may be coupled to the one or more IC die via an interconnection layer. The interposer may include one or more electrically active devices configured to provide one or more security functions to secure the one or more circuits. The interposer may be coupled to a backside power of the IC package. In some embodiments, the backside power of the IC package may include one or more backside power delivery networks.

16 Claims, 7 Drawing Sheets

<u>350</u>

200

600

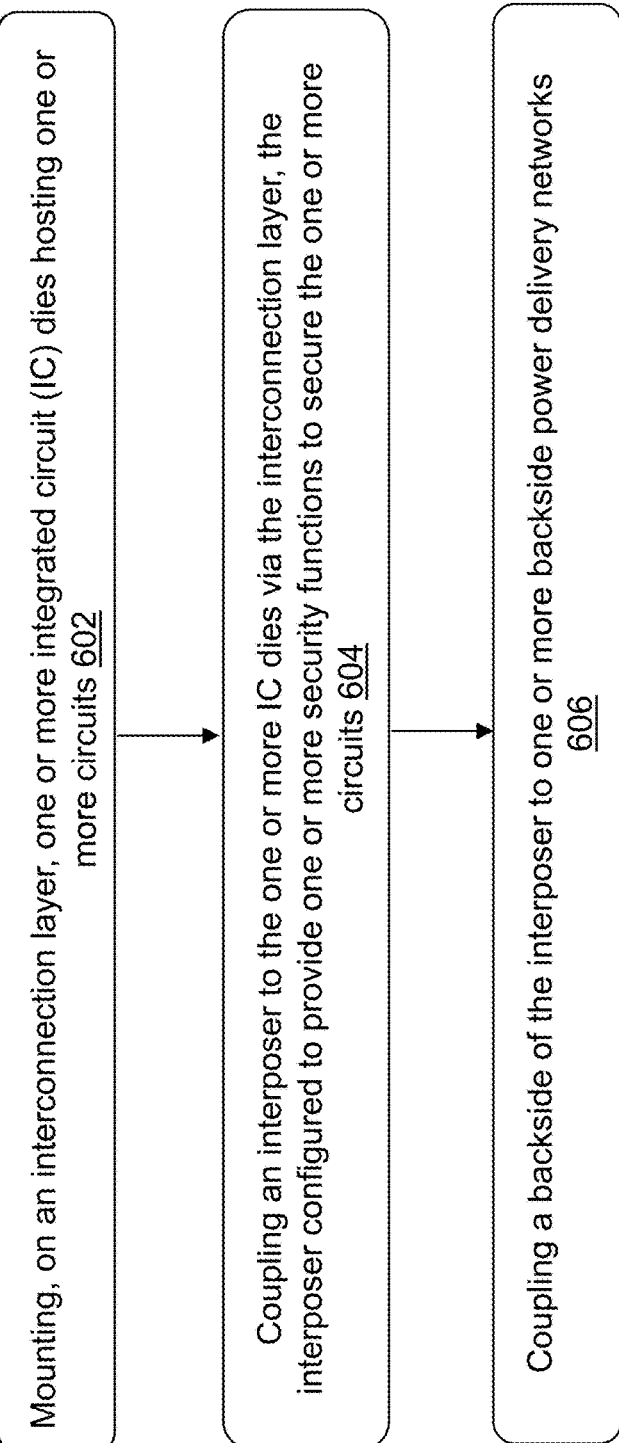

Mounting, on an interconnection layer, one or more integrated circuit (IC) dies hosting one or more circuits 602

Coupling an interposer to the one or more IC dies via the interconnection layer, the interposer configured to provide one or more security functions to secure the one or more circuits 604

Coupling a backside of the interposer to one or more backside power delivery networks 606

FIG. 6

SYSTEMS AND METHODS FOR PROVIDING DYNAMIC SECURITY FABRIC INTERPOSERS IN HETEROGENEOUSLY INTEGRATED SYSTEMS

FIELD OF THE DISCLOSURE

This disclosure generally relates to systems and methods for managing a secure infrastructure of integrated packages, and more particularly to providing an interposer that includes one or more electrically passive and/or active devices configured to provide one or more security functions to secure one or more circuits.

BACKGROUND

Advanced packaging (AP) allows multiple devices to be merged and packaged as a single electronic device. AP employs heterogeneous integration (HI) technologies which integrate separately manufactured components into a higher-level assembly, to achieve system scaling and SWAP-C (Size, Weight, Power and Cost) and enable artificial intelligence (AI) systems, edge computing systems, and/or complex aggregated or disaggregated systems for sensing (RADAR/LIDAR, environmental), communications (5G/6G), autonomy (AI/machine learning (ML)), etc. AP Systems can enable new functionality via aggregation of components in device packages rather than across laminate printed circuit boards (PCBs). AP makes it possible to integrate systems once requiring multiple PCB's or several ball grid array (BGA) packaging components, into a single package. As a result, the provenance and content of each disparate component in a package become subject to trust, anti-tamper, and secure micro-electronics (ME) ecosystem as required by governments. An embrace of the flexibility inherent to AP technology is important, but with it comes a potential risk of failing to meet the requirements of the trust, anti-tamper, and secure ME ecosystem.

SUMMARY

The present solution is directed to managing a secure infrastructure of integrated packages that are manufactured using AP methods. According to one aspect of the disclosure, a system may include an integrated circuit (IC) package. The IC package may include one or more IC die (or chiplets) hosting one or more circuits, and an interposer. The interposer may be coupled to one or more IC die via electrically active interconnection layer(s). For example, the interposer is coupled to the one or more IC die via a redistribution layer (RDL). The interposer may include one or more passive or active devices i.e., metal wiring and contacts, capacitors, resistors, inductors, photonics circuits, electrically active devices, configured to provide one or more functions to secure the interposer, and one or more die or chiplets, sensors, and "components" connected to it, as well as the volume of the packaged components. An interposer, typically fabricated as a passive, double sided component that enables fan-out connectivity between a "package substrate", ball grid array (or similar), on one side, and bonded components via metal wiring and solder bumps, ubumps, or integrated bonded metal (e.g., hybrid Cu) and dielectric bonding, on the opposite side. Connectivity between the back and front side of an interposer is facilitated by use of Through-Si Vias (TSV's) to bridge wiring networks on each side of the interposer. In some embodiments, an interposer can be enabled to provide functionality that's considered "active" to enable electrical circuits, and passive electric devices, etc., An active interposer fabricated to enable a backside power delivery network capability could be used instead of a passive interposer, to enable opportunities to control functionality within the packaged system to address a security agenda. For example, the interposer may be coupled via a backside power delivery strategy to the IC package. The electrically active devices in the interposer can be powered via metallized wiring and metalized bumps connections to a metalized grid on the IC package. In some embodiments, the metallized wiring may include TSV's, uTSV's, and/or an RDL.

In some embodiments, one or passive layers may be coupled to the die side surface of the active interposer to facilitate a flexible and low cost alternative to address differences in design and solder bump connectivity that may occur when between one or more IC die and include one or more passive components configured to secure the one or more circuits. The interposer may be coupled to a second surface of the one or more IC die, or a packaging specific substrate, opposite to the first surface.

In some embodiments, the one or more IC die may include a first IC die hosting a first circuit and a second IC die hosting a second circuit. The one or more electrically active devices may be configured to secure the first circuit and the second circuit. The one or more electrically active devices may be configured to obfuscate the one or more circuits.

In some embodiments, the one or more IC die may include a first IC die and a second IC die. The one or more electrically active devices may be configured to provide a first connection structure with which the first IC die is connected to the second IC through the interposer. In response to the first IC die being replaced with a third IC die, the one or more electrically active devices may be configured to provide a second connection structure with which the third IC die is connected to the second IC through the interposer.

In some embodiments, the one or more security functions may include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

According to another aspect of the disclosure, an interposer of an integrated circuit (IC) package that includes one or more IC die hosting one or more circuits, may include one or more electrically active devices. The one or more electrically active devices may be configured to provide one or more security functions to secure the one or more circuits. The interposer may be coupled to a backside power of the IC package. The interposer is coupled to the one or more IC die via a metalized Re-Distribution Layer (RDL) as an interconnection layer. In some embodiments, the one or more electrically active devices may be configured to obfuscate the one or more circuits.

In some embodiments, the backside power of the IC package may include one or more backside power delivery networks.

In some embodiments, the IC package may include one or more passive layers coupled to a first surface of the one or more IC die. The one or more passive layers may include one or more passive components configured to secure the one or more circuits. The interposer may be coupled to a second surface of the one or more IC die opposite to the first surface.

In some embodiments, the one or more IC die may include a first IC die hosting a first circuit and a second IC die hosting a second circuit. The one or more electrically active devices may be configured to secure the first circuit and the second circuit.

In some embodiments, the one or more IC die may include a first IC die and a second IC die. The one or more electrically active devices may be configured to provide a first connection structure with which the first IC die is connected to the second IC die through the interposer. In response to the first IC die being replaced with a third IC die, the one or more electrically active devices may be re-configured to provide a second connection structure with which the third IC die is connected to the second IC through the interposer.

In some embodiments, the one or more security functions resident or located on the interposer (instead of being located on the die) may include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

According to another aspect of the disclosure, a method may include mounting, on an interconnection layer, one or more integrated circuit (IC) die hosting one or more circuits. The method may include coupling an interposer to the one or more IC die via the interconnection layer. The interposer may be configured to provide one or more security functions to secure the one or more circuits. The method may include coupling a backside of the interposer to one or more back-side power delivery networks.

In some embodiments, a passive layer(s) may be formed to be coupled to a first surface of the one or more IC die and to include one or more passive components configured to secure the one or more circuits. The interposer may be coupled to a second surface of the one or more IC die opposite to the first surface.

In some embodiments, the interposer may be formed to include one or more electrically active devices as die, or chiplets. In some embodiments, the one or more IC die may include a first IC die hosting a first circuit(s) and a second IC die hosting a second circuit(s). The one or more electrically active devices may be configured to secure the first circuit and the second circuit.

In some embodiments, the one or more IC die may include a first IC die and a second IC die. The one or more electrically active devices may be configured to provide a first connection structure with which the first IC die is connected to the second IC through the interposer. In response to the first IC die being replaced with a third IC die, the one or more electrically active devices may be configured to provide a second connection structure with which the third IC die is connected to the second IC through the interposer.

In some embodiments, the one or more security functions may include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 6 is a flow diagram showing a process for manufacturing an IC package, in accordance with an embodiment.

Figure 1:
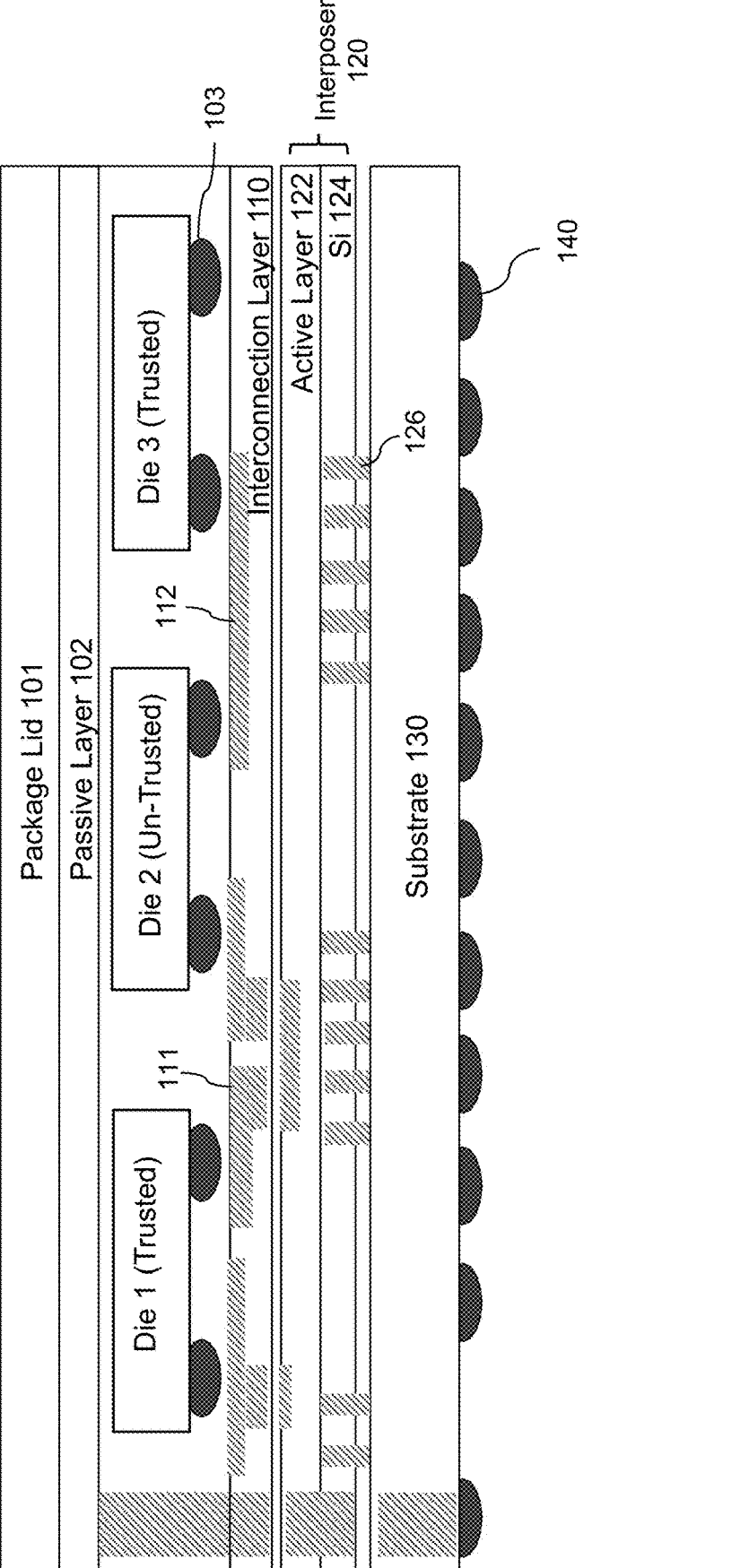
FIG. 1 is a diagram of an integrated circuit (IC) package, in accordance with an embodiment.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Advanced packaging (AP) allows multiple devices to be merged and packaged as a single electronic device or system. AP employs heterogeneous integration (HI) technologies which integrate separately manufactured components into a higher-level assembly, to achieve system SWAP-C(Size, Weight, Power and Cost) and satisfy complex systems requirements i.e., artificial intelligence (AI), and/or edge computing. AP Systems can enable new functionality via aggregation of components in device packages rather than across laminate printed circuit boards (PCBs). AP makes it possible to integrate systems once requiring multiple PCB's or several ball grid array (BGA) packaging components, into a single package. As a result, the provenance and content of each disparate component in a package become subject to trust, anti-tamper, and secure micro-electronics (ME) ecosystem as required by governments. An embrace of the flexibility inherent to AP technology is important, but with it comes a potential risk of failing to meet the requirements of the trust, anti-tamper, and secure ME ecosystem.

In addition, the use of AP methods allows for the integration of multiple die or chiplets, on a substrate to form a complex functioning system. Examples include mixed architectures to address edge computing applications for disaggregated radar systems with integrated capability (capability including, for example, beam shaping and steering, AI, memory, logic, radio frequency transmitter/receiver (RF TX/RX), antennas, and/or photonics enabled intra platform connectivity). It would be difficult to manage all these components to satisfy meet the requirements of the trust, anti-tamper, and secure ME ecosystem. For example, there are difficulties in managing such a complex system from the vantage point of a single location of a board or substrate primarily from a span of control perspective. It is also true that an integrated package may be constrained with limited functionality, as its form factor is limited by the critical area it already consumes (e.g., an interposer, a packaging substrate, etc.). Therefore, there is a need to manage a secure infrastructure of integrated packages that are manufactured using AP methods.

To solve this problem, according to certain aspects, embodiments in the present disclosure relate to techniques for providing a multi-layer package level subsystem component, referred to as a dynamic security fabric interposer (DSFI), designed to augment and/or facilitate secure ME System architectures via application of AP technology solutions. In some embodiments, an ME device or an ME component may include an interposer (e.g., DSFI) such that security functions (e.g., encryption and continuous monitoring, or built-in capability to circumvent physical and electromagnetic attacks via catastrophic kinetic events) can be performed using the interposer.

In some embodiments, an integrated circuit (IC) package may include but not be limited to, a package lid (e.g., metal or ceramic lid), a passive secure fabric layer (or passive layer), one or more die, one or more balls, C4, bumps (e.g., solder bumps), an interconnect layer or a single or multi-level redistribution layer (RDL), an interposer, a package substrate, and/or BGA balls (e.g., solder ball or bumps). The IC package may implement an advanced packaging (AP) systems design. The passive secure fabric layer may include, as a passive security fabric (PSF), one or more (passive) electric or photonic components. In this manner, the PSF may enable volume security via electric or photonic enabled passive security as a disruption of continuity or performance.

The one or more die may include known good die (KGD) or die with open-source designs. The one or more die may have flexibility in provenance and/or design. The interconnection layer may include at least one of a single, or multi-level metalized redistributions layer (RDL) or 3D integrated wring "bridge" configured to connect between the one or more die and the interposer. The Package substrate may include one or more in-package electrical or optical input/output (OIO) chiplets, sensors, known good ME die (KGD), with open, or constrained-source designs.

In some embodiments, the interposer may include a DSFI Interposer layer ( ) and a silicon (Si), III-V, SiC, dielectric, or organic replacement layer. The DSFI may include one or more active components (e.g., electrically active devices including but not limited to complementary metal-oxide semiconductor (CMOS), fin field-effect transistor (FinFET), memory devices, capacitors, and inductors) of mixed provenance and device design generations. In some embodiments, the interposer may function as an embedded "smart" active package security component. The package-level (security) functionality of the interposer may include at least one of encryption/decryption, secure boot functions, root of trust (or root of trust core), controller and cache functions, data collection, photonic I/O and security solutions, random number generation (e.g., using certified Federal Information Processing Standards (FIPS), Security Evaluation Standard for IoT Platforms (SESIP), or the Common Criteria for Information Technology Security Evaluation (Common Criteria or CC)), and/or anti-tamper. The package-level security functionality of the interposer may provide robust AP security solutions to the diverse and complex system architectures that are made possible by heterogeneous integration (HI) technologies.

In some embodiments, the active secure fabric layer may include one or more active devices (e.g., CMOS devices), and one or more passive devices (e.g., TSV's, Capacitors, Metalized wiring). For example, the active secure fabric layer may be a State-of-the-Art (SOTA) CMOS logic device platform. The active secure fabric layer may provide an infrastructure to enable inter-level and intra-level power delivery between the one or more die (e.g., heterogeneously integrated, mixed trust ME die(s)) and the package substrate. The active secure fabric layer may provide a root of trust (e.g., hardware root of trust) as a flexible and dynamic package level solution. For example, the active secure fabric layer may be designed to be compliant with the Defense Advanced Research Projects Agency (DARPA) Supply Chain Hardware Integrity for Electronics Defense (SHIELD) asymmetric security solutions to provide a systemic root of trust. In some embodiments, processing of the active security fabric layer (e.g., test and verification of the active security fabric layer) may be performed in an secure environment (e.g., onshore, trust and secure foundry environment).

In some embodiments, the silicon layer may be a thinned Si substrate (e.g., with a depth of 3-5 μm). For example, AP wafer scale integration methods may be employed to realize/implement the thinned Si substrate. The silicon layer may include one or more through-silicon vias (TSVs; e.g., standard TSVs or μTSVs or nano-TSVs) connected with a backside power delivery (BSPD) substrate through backside metal (BSM). In some embodiments, connectivity to a BGA package can be made/managed from the backside of the active secure fabric layer through TSV connectivity (e.g., standard TSVs or μTSVs or nano-TSVs), Cu damascene fan-out (FO) wiring, and/or solder bump connectivity. In some embodiments, the backside of the active secure fabric layer 122 may include structures for power conditioning, or photonic network infrastructure. In some embodiments, connectivity from the front side of the active secure fabric layer may be made/managed through the interconnection layer. For example, the interconnection layer may be a multilayer Cu FO RDL (referred to as "adaptive RDL"). In this manner, devices in the interposer (e.g., CMOSs or FinFETs) may be connected to the backside and front side of a wafer.

In some embodiments, the one or more die may be heterogeneously integrated onto the substrate via the active secure fabric layer and/or the interconnection layer (e.g., the active secure fabric layer/active RDL-enabled substrate) using one of solder bumps (e.g., solder μbumps) or hybrid Cu bond technology. Hybrid Cu bond may be a preferred method from both a security and system performance perspective.

In some embodiments, the entire IC package may be over-molded, prepared with an RDL. The IC package may be encapsulated with the passive secure fabric layer, which is an overlayer of passive secure fabric (e.g., electromagnetic or photonic security circuitry). The components of the IC package may be solder bumped (to form BGA balls) on a backside of the package substrate), deposited on a wafer, and/or diced for final testing.

In some embodiments, the active secure fabric layer may implement asymmetric security solutions (e.g., DARPA SHIELD enable design). For example, the active secure fabric layer may include (1) non-resettable, "always on" intrusion sensors on a die (or a die-lette), (2) on-board encryption symmetric key that cannot be "coaxed" from a die (or a die-lette), (3) ID and key that are unique to an individual host IC (e.g., ID and key that are not just a part number), (4) an interrogation history (date, time, location) stored on a secure server, or (5) built-in friable structures that can kill die-lette if removal from a host is attempted. In some embodiments, the interposer (e.g., DSFI) may include one or more "active security fabric" (ASF) components that are one or more CMOS devices (e.g., an SOTA CMOS logic device platform), designed and fabricated in a trusted and secure foundry. The ASF components may be integrated with a backside power delivery substrate or network using an AP method.

In one aspect, as another example of a passive interposer architecture, an IC package may include a plurality of chips on top of a passive interposer using heterogeneous integration (HI) technologies which can integrate separately manufactured components into a higher-level assembly. The chips may include one or more CMOS chips and one or more memory chips. Each CMOS chip may include CMOS logic cores, cache, and a control function. Each memory chip may include one or more memory cells and a control function. Examples of the control function include security functions such as "root of trust." The comparative example using a passive interposer may enable a significant and uncontrolled attack surface due to unprotected functionality or untrusted content, when, for example, combined with content from offshore and/or open-source foundries. Due to the lack of functionality, this example of the passive interposer architecture may require the "root of trust" to be co-located at the die level or to be enabled in a die format. While functional, the die-level root of trust solution may suffer due to constraints related to span of control, and due to a lack of space on the passive interposer to accommodate an additional die footprint in complex system in a package (SiP) designs.

In some embodiments, an IC package may include a plurality of chips on top of an active interposer (e.g., DSFI). The chips may include one or more CMOS chips and one or more memory chips. Each CMOS chips may include CMOS logic cores and cache, and each memory chip may include one or more memory cells. The active interposer may include, as active security fabric (ASF) components, a plurality of control functions associated with corresponding chips (e.g., CMOS chip or memory chip) of the plurality of chips. In some embodiments, the active interposer may include one or more field programmable gate arrays (FP-GAs) that can be programmable to implement the plurality of control functions (e.g., connectivity controls, security controls or memory controls) associated with the corresponding chips. In some embodiments, the control functions can be implemented using firmware and/or software that can be executable by one or more processors. The active interposer may include a plurality of TSVs (e.g., standard TSVs or μTSVs or nano-TSVs) connected with one or more backside power delivery (BSPD) substrates/networks, and a plurality of embedded multi-die interconnect bridges (EMIBs) which provide in-package high-density interconnect of heterogeneous chips. The active interposer may function as a trusted "immutable" hardware component. In this manner, the active interposer (e.g., DSFI) can enable (1) off-loading of critical intellectual properties (IPs) from chips, (2) relocating key components to a trusted platform to limit an attack surface, (3) performance benefits, and/or (4) providing unique "span of control' opportunities in HI systems, and/or (5) providing local/systemic and sophisticated trust solutions using HI systems via SOTA CMOS controller functionality from a trusted source. For example, a HI system including an active interposer (e.g, DSFI) can provide a focused "root of trust" that resides within the ASF component included in the DSFI. In some embodiments, vulnerable control functions may be co-located in logic and memory devices (e.g., CMOS chips or memory chips) with an active, complex, and adaptable barrier enabled to provide an immutable hardware solution to meet the requirements of the trust, anti-tamper, and secure ME ecosystem.

In another aspect and as another example of a passive interposer architecture, an IC package may include a plurality of die (e.g., first die, second die, third die, fourth die) on a passive interposer (e.g., first passive interposer, second passive interposer). In an initial configuration, the first passive interposer is configured such that the first die and the second die are connected via a wire (on the front side of the interposer) between a first connection point and a second connection point, and the second die and the third die are connected via a wire (on the front side of the interposer) between a third connection point and a fourth connection point. In a redesigned configuration, the first die is replaced/exchanged with a fourth die. In the redesigned configuration, the first passive interposer is redesigned into a second passive interposer such that the fourth die and the second die are connected via a wire (on the front side of the interposer) between a fifth connection point and the second connection point. In some embodiments, the wires on the front side of the interposer may be formed using Cu back end of line (BEOL) "Fan-In" wiring on the front side of the interposer. The interposer may have Cu BEOL "Fan-Out" wiring on the backside of the interposer, with connectivity between the front side and backside enabled through one or more Cu TSVs and connectivity from the interposer to a packaging substrate via one or more solder bumps. The comparative example represents a wiring-only passive interposer design in which the interposer would have to be redesigned or replaced if one of the die is exchanged with a new die or a change in interconnection between die occurs.

In some embodiments, an IC package may include a plurality of die (e.g., first die, second die, third die, fourth die) on an active interposer (e.g., DSFI) including one or more embedded logic/memory functions. In some embodiments, the logic/memory functions may include one or more CMOS electrically active devices. In some embodiments, the active interposer may include one or more FPGAs that can be programmable to implement the logic/memory functions (e.g., connectivity controls, security controls or memory controls) associated with the corresponding chips. In some embodiments, the logic/memory functions can be implemented using firmware and/or software that can be executable by one or more processors. The one or more electrically active devices can be configured to connect between any connection points among a plurality of connection points (e.g., first-to-fifth connection points). In some embodiments, the locations of the plurality of connection points on the active interposer may be predetermined, and the plurality of connection points may be wired on the front side of the interposer via the one or more CMOS electrically active devices. In some embodiments, the wiring on the front side of the interposer may be formed using Cu BEOL "Fan-In" wiring on the front side of the interposer. The interposer may have Cu BEOL "Fan-Out" wiring on the backside of the interposer, with connectivity between the front side and backside enabled through one or more Cu TSVs and connectivity from the interposer to a packaging substrate via one or more solder bumps In an initial configuration, the one or more CMOS electrically active devices of the active interposer are configured such that the first die and the second die are connected via the one or more CMOS electrically active devices between the second connection point and the third connection point, and the first connection point, the fourth connection point and the fifth connection point are not connected to any other connection points. In a second configuration, the first die is replaced/exchanged with a fourth die. In the second configuration, the same one or more CMOS electrically active devices of the active interposer are configured such that the fourth die, the second die and the third die are connected via the one or more CMOS electrically active devices between the first connection point, the third connection point, and the fifth connection point, and the second connection point and the fourth connection point are not connected to any other connection points. The same active interposer can be used to adapt new connectivity between die even if one of the die is exchanged with a new die or a change in interconnection between die occurs, thereby avoiding the need to redesign the interposer In this manner, changes in intellectual property (IP) (e.g., change from the first die to the fourth die) and system functionality (e.g., security functionality) can be programmable via the one or more electrically active devices, thereby providing advantage in span of control and security (e.g., via encrypted secure IP and isolation of control functions).

In some approaches, a system may include an integrated circuit (IC) package. The IC package may include one or more IC die hosting one or more circuits, and an interposer. The interposer may be coupled to the one or more IC die via an interconnection layer. The interposer may include one or more electrically active devices configured to provide one or more security functions to secure the one or more circuits. The interposer may be coupled to a backside power of the IC package. In some embodiments, the backside power of the IC package may include one or more backside power delivery networks.

In some embodiments, a passive layer(s) may be coupled to a first surface of the one or more IC die and include one or more passive components configured to secure the one or more circuits. The interposer may be coupled to a second surface of the one or more IC die opposite to the first surface.

In some embodiments, the one or more IC die may include a first IC die hosting a first circuit and a second IC die hosting a second circuit. The one or more electrically active devices may be configured to secure the first circuit and the second circuit. The one or more electrically active devices may be configured to obfuscate the one or more circuits.

In some embodiments, the one or more IC die may include a first IC die and a second IC die. The one or more electrically active devices may be configured to provide a first connection structure with which the first IC die is connected to the second IC through the interposer. In response to the first IC die being replaced with a third IC die, the one or more electrically active devices may be configured to provide a second connection structure with which the third IC die is connected to the second IC through the interposer.

In some embodiments, the one or more security functions may include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

In some approaches, an interposer of an integrated circuit (IC) package includes one or more IC die hosting one or more circuits, may include one or more electrically active devices. The one or more electrically active devices may be configured to provide one or more security functions to secure the one or more circuits. The interposer may be coupled to a backside power of the IC package. The interposer is coupled to the one or more IC die via an interconnection layer. In some embodiments, the one or more electrically active devices may be configured to obfuscate the one or more circuits. In some embodiments, the backside power of the IC package may include one or more backside power delivery networks.

In some embodiments, the IC package may include a passive layer(s) coupled to a first surface of the one or more IC die. The passive layer(s) may include one or more passive components configured to secure the one or more circuits. The interposer may be coupled to a second surface of the one or more IC die opposite to the first surface.

In some embodiments, the one or more IC die may include a first IC die hosting a first circuit and a second IC die hosting a second circuit. The one or more electrically active devices may be configured to secure the first circuit and the second circuit.

In some embodiments, the one or more IC die may include a first IC die and a second IC die. The one or more electrically active devices may be configured to provide a first connection structure with which the first IC die is connected to the second IC through the interposer. In response to the first IC die being replaced with a third IC die, the one or more electrically active devices may be configured to provide a second connection structure with which the third IC die is connected to the second IC through the interposer.

In some embodiments, the one or more security functions may include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

Embodiments in the present disclosure have at least the following advantages and benefits. First, embodiments in the present disclosure can provide useful techniques for providing a dynamic security fabric interposer (DSFI) as an Advanced Packaging enabled solution to address security in highly complex systems architectures. The DSFI as a trusted and secure component can implement a highly complex, adaptable, SOTA ME system. In a mixed (open/trusted) IP environment, the DSFI can provide a lifetime secure and reconfigurable systems solution, accelerating and enabling a more viable approach to the trust, anti-tamper, and secure ME ecosystem as required by governments. The DSFI can embed vulnerable logic and memory controller functionality to be co-located in a centralized root of trust, DARPA SHIELD enabled package component. The dynamic nature of the DSFI as a secure component would enable the re-purposing of system functionality in ways not previously envisioned.

Second, embodiments in the present disclosure can provide useful techniques for providing a DSFI component with connectivity to backside power delivery networks (BSPD). Moreover, a simple and adaptable RDL connectivity can be provided between the DSFI component and one or more die to enable high bandwidth, low loss connectivity.

FIG. 1 is a diagram of an integrated circuit (IC) package 100, in accordance with an embodiment. FIG. 1 represents a cross section of heterogeneously integrated die on an active interposer (e.g., DSFI). The IC package 100 may include a package lid 101 (e.g., metal or ceramic lid), a passive secure fabric layer (or passive layer) 102, one or more die (e.g., die 1, die 2, die 3), one or more bumps 103 (e.g., solder bumps), an interconnection layer or a redistribution layer (RDL) 110, an interposer 120 (e.g., DSFI), a package substrate 130, and/or BGA balls 140 (e.g., solder ball or bumps). The IC package 100 may implement an advanced packaging (AP) systems design. The passive secure fabric layer 102 may include, as a passive security fabric (PSF), one or more (passive) electric or photonic components which are manufactured by a secure foundry. In this manner, the PSF may enable volume security via electric or photonic enabled passive security.

The one or more die may include known good die (KGD) or die with open-source designs. The one or more may include one or more trusted die (e.g., die 1, die 3) and/or one or more untrusted die (e.g., die 2 that has not been authenticated). The interconnection layer 110 may include at least one of an active 3-dimensional (3D) bridge 111 or a passive 3D bridge 112 which are configured to connect between the one or more die and the interposer 120. The package substrate 130 may include one or more in-package optical input/output (OIO) chiplets, photonics known good wafer (KGW), or RDL with open-source designs.

The interposer 120 may include an active secure fabric layer (or active layer) 122 and a silicon (Si) layer 124. The active secure fabric layer 122 may include one or more active components (e.g., electrically active devices such as CMOS, FinFET) which are manufactured by a secure foundry. The interposer 120 may function as an embedded "smart" active package security component. The package-level (security) functionality of the interposer 120 may include at least one of encryption/decryption, secure boot functions, root of trust (or root of trust core) friendly, controller and cache functions, data collection, photonic security solutions, random number generation, SWaP-C, and/or anti-tamper. The package-level security functionality of the interposer 120 may provide robust AP security solutions to the diverse and complex system architectures that are made possible by HI technologies.

The active secure fabric layer 122 may include one or more active devices (e.g., CMOS devices). The active secure fabric layer 122 may include a small-sized CMOS device, e.g., smart 7 nm (nanometer) CMOS. For example, the active secure fabric layer 122 may be a SOTA CMOS logic device platform, designed and fabricated in a trusted and secure foundry. The active secure fabric layer 122 may provide an infrastructure to enable inter-level and intra-level power delivery between the one or more die (e.g., heterogeneously integrated, mixed trust ME die(s)) and the package substrate. The active secure fabric layer 122 may provide a root of trust (e.g., hardware root of trust) as a flexible and dynamic package level solution. For example, the active secure fabric layer 122 may be designed to be compliant with the DARPA SHIELD asymmetric security solutions to provide a systemic root of trust. Processing of the active security fabric layer 122 (e.g., test and verification of the active security fabric layer) may be performed in an secure environment (e.g., onshore, trust and secure foundry environment). The active secure fabric layer 122 may implement asymmetric security solutions (e.g., DARPA SHIELD enable design). For example, the active secure fabric layer 122 may include (1) non-resettable, "always on" intrusion sensors on a die (or a die-lette), (2) on-board encryption symmetric key that cannot be "coaxed" from a die (or a die-lette), (3) ID and key that are unique to an individual host IC (e.g., ID and key that are not just a part number), (4) an interrogation history (date, time, location) stored on a secure server, or (5) built-in friable structures that can kill die-lette if removal from a host is attempted. The interposer (e.g., DSFI) 120 may include one or more "active security fabric" (ASF) components that are one or more CMOS devices (e.g., an SOTA CMOS logic device platform), designed and fabricated in a trusted and secure foundry. The ASF components may be integrated with a backside power delivery substrate or network (see FIG. 2) using an AP method.

Connectivity from the interposer 120 to a BGA package (e.g., substrate 130/BGA balls 140) can be made/managed from the backside of the active secure fabric layer 122 through TSV connectivity 126 (e.g., standard TSVs or μTSVs or nano-TSVs), Cu damascene fan-out (FO) wiring, and/or solder bump connectivity. In some embodiments, the backside of the active secure fabric layer 122 may include structures for power conditioning, or photonic network infrastructure. Connectivity from the front side of the active secure fabric layer 122 may be made/managed through the interconnection layer 110. For example, the interconnection layer 110 may be a multilayer Cu FO RDL (referred to as "adaptive RDL"). In this manner, devices in the interposer 120 (e.g., CMOSs or FinFETs) may be connected to the backside and front side of a wafer. The one or more die may be heterogeneously integrated onto the substrate 130 via the active secure fabric layer 122 and/or the interconnection layer 110 using one of solder bumps (e.g., solder μbumps) or hybrid Cu bond technology. Hybrid Cu bond may be a preferred method from both a security and system performance perspective.

The entire IC package 100 may be over-molded, prepared with an RDL. The IC package 100 may be encapsulated with the passive secure fabric layer 102, which is an overlayer of passive secure fabric (e.g., electromagnetic or photonic security circuitry). The components of the IC package 100 may be solder bumped (to form BGA balls 140) on a backside of the package substrate 130), deposited on a wafer, and/or diced for final testing.

Figure 2:
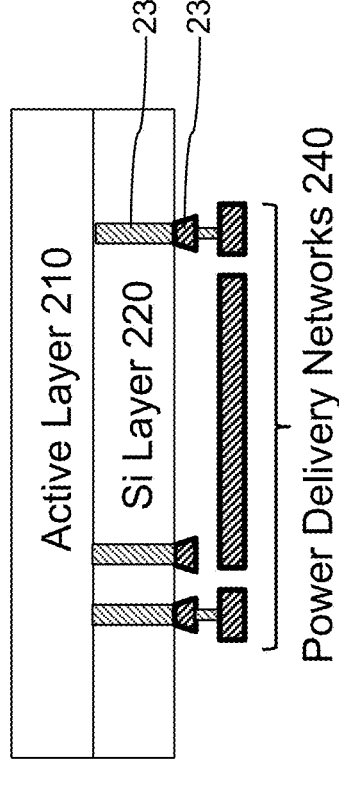
FIG. 2 is a diagram of an interposer, in accordance with an embodiment.

FIG. 2 is a diagram of an interposer 200, in accordance with an embodiment. In some embodiments, the interposer 200 may include an active secure fabric layer (or active layer) 210 and an Si layer 220. The Si layer 220 may be a thinned Si substrate (e.g., with a depth of 3-5 μm). For example, AP wafer scale integration methods may be employed to realize/implement the thinned Si substrate. The Si layer 220 may include one or more through-silicon vias (TSVs 231; e.g., standard TSVs or μTSVs or nano-TSVs) connected with a backside power delivery (BSPD) substrate/network 240 through backside metal (BSM) 232, thereby functioning as "smart interposer" and enabling 3D power delivery functionality (e.g., smart back side secure network connectivity).

Figure 3A:
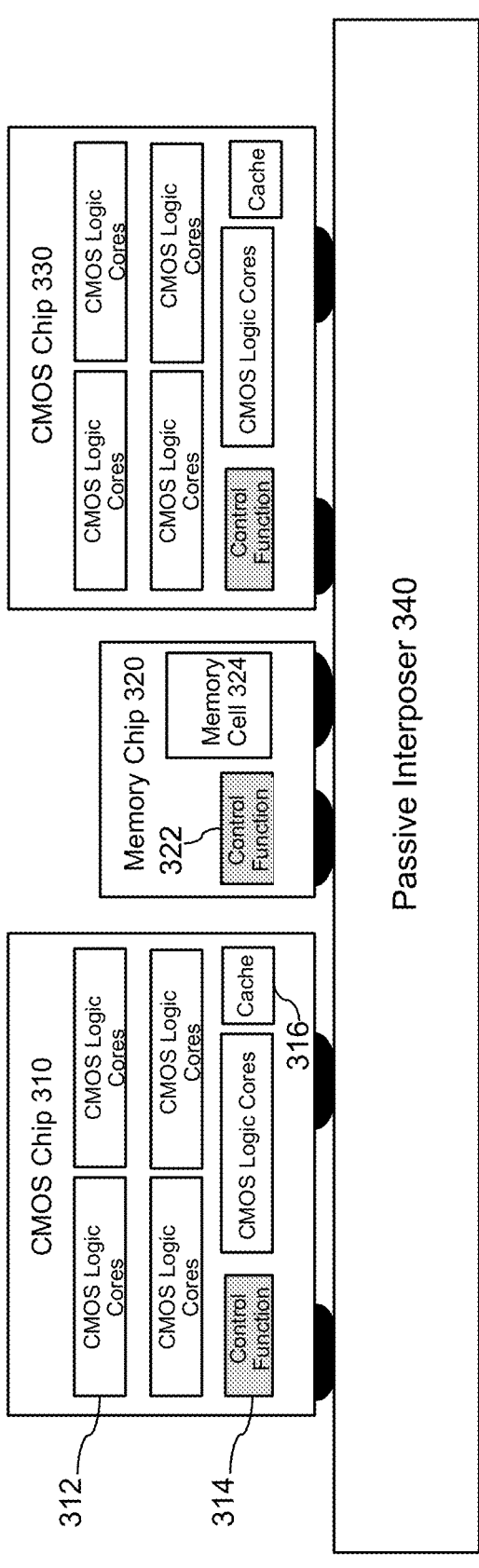
FIG. 3A is a diagram of an IC package, as another example.

FIG. 3A is a diagram of an IC package 300, as another example of a passive interposer architecture. The IC package 300 may include a plurality of chips 310, 320, 330 on top of a passive interposer 340 using heterogeneous integration (HI) technologies which can integrate separately manufactured components into a higher-level assembly. The chips may include one or more CMOS chips 310, 330 and one or more memory chips 320. Each CMOS chip may include CMOS logic cores 312, cache 316, and a control function 314. Each memory chip may include one or more memory cells 324 and a control function 322. Examples of the control function include security functions such as "root of trust." The comparative example using a passive interposer 340 may enable a significant and uncontrolled attack surface due to unprotected functionality or untrusted content, when, for example, combined with content from offshore and/or open-source foundries. Due to the lack of functionality, this example of the passive interposer architecture may require the "root of trust" to be co-located at the die level or to be enabled in a die format, as shown in FIG. 3A. While functional, the die-level root of trust solution may suffer due to constraints related to span of control, and due to a lack of space on the passive interposer to accommodate an additional die footprint in complex system in a package (SiP) designs.

Figure 3B:
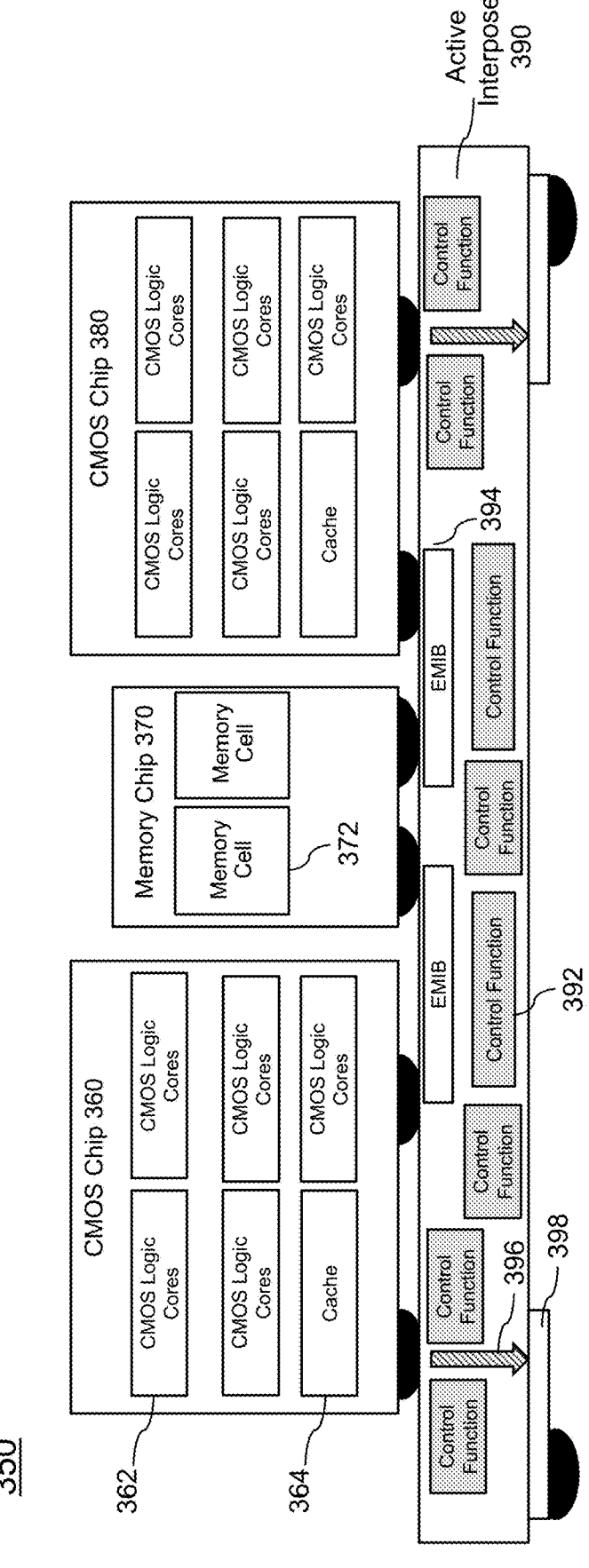
FIG. 3B is a diagram of an IC package, in accordance with an embodiment.

FIG. 3B is a diagram of an IC package 350, in accordance with an embodiment. In contrast to the example shown in FIG. 3A, the IC package 350 may include a plurality of chips 360, 370, 380 on top of an active interposer (e.g., DSFI) 390. The chips may include one or more CMOS chips 360, 380 and one or more memory chips 370. Each CMOS chips may include CMOS logic cores 362 and cache 364, and each memory chip may include one or more memory cells 372. The active interposer 390 may include, as active security fabric (ASF) components, a plurality of control functions 392 associated with corresponding chips (e.g., CMOS chip or memory chip) of the plurality of chips 360, 370, 380. The active interposer 390 may include one or more FPGAs that can be programmable to implement the plurality of control functions 392 (e.g., connectivity controls, security controls or memory controls) associated with the corresponding chips. In some embodiments, the control functions can be implemented using firmware and/or software that can be executable by one or more processors. The active interposer 390 may include a plurality of TSVs 396 (e.g., standard TSVs or µTSVs or nano-TSVs) connected with one or more BSPD substrates/networks 398, and a plurality of EMIBs 394 which provide in-package high-density interconnect of heterogeneous chips. The active interposer may function as a trusted "immutable" hardware component. In this manner, the active interposer 390 (e.g., DSFI) can enable (1) offloading of critical intellectual properties (IPs) from chips. (2) relocating key components to a trusted platform to limit an attack surface, (3) performance benefits, and/or (4) providing unique "span of control' opportunities in HI systems, and/or (5) providing local/systemic and sophisticated trust solutions using HI systems via SOTA CMOS controller functionality. For example, a HI system including an active interposer (e.g., DSFI) 390 can provide a focused "root of trust" that resides within the ASF component included in the DSFI.

Figures 4A, 4B:
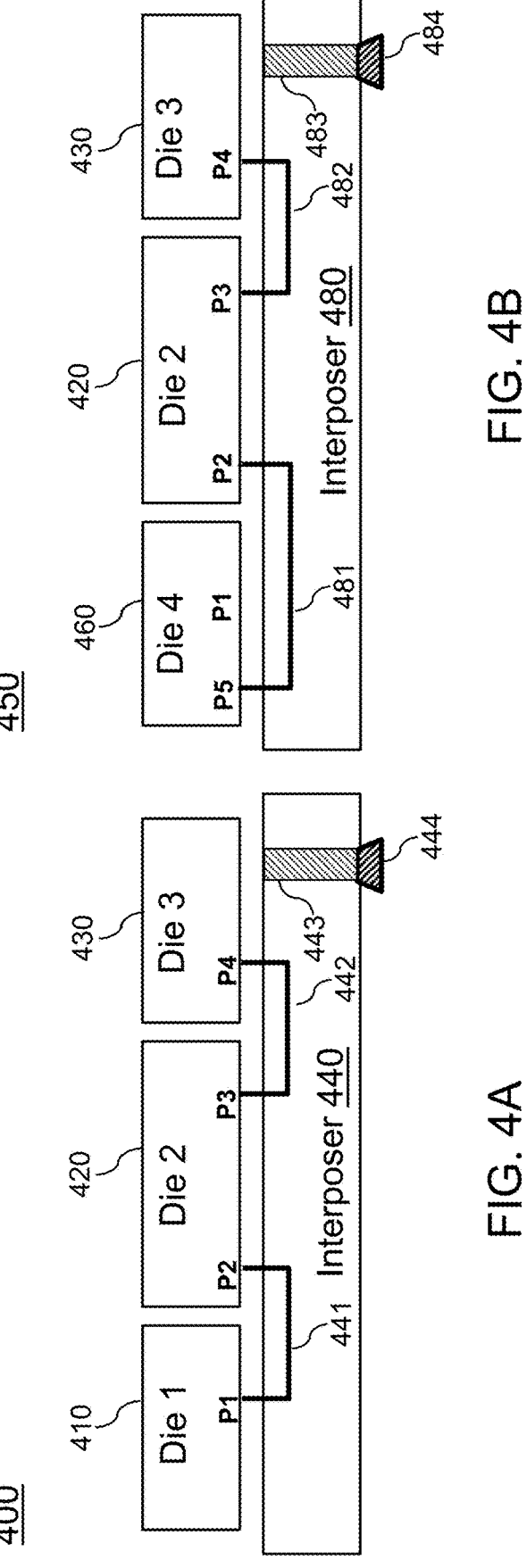
FIG. 4A and FIG. 4B are diagrams of an interposer, as another example.

FIG. 4A and FIG. 4B are diagrams of an interposer, as another example of a passive interposer architecture. An IC package may include a plurality of die (e.g., first die 410, second die 420, third die 430, fourth die 460) on a passive interposer (e.g., first passive interposer 440, second passive interposer 480). In an initial configuration 400, the first passive interposer 440 is configured such that the first die 410 and the second die 420 are connected via a wire 441 (on the front side of the interposer 440) between a first connection point P1 and a second connection point P2, and the second die 420 and the third die 430 are connected via a wire 442 (on the front side of the interposer 440) between a third connection point P3 and a fourth connection point P4. In a redesigned configuration 450, the first die 410 is replaced/exchanged with the fourth die 460. In the redesigned configuration 450, the first passive interposer 440 is redesigned or replaced into the second passive interposer 480 such that the fourth die 460 and the second die 420 are connected via a wire 481 (on the front side of the interposer 480) between a fifth connection point P5 and the second connection point P2. In some embodiments, the wires 441, 442, 481, 482 on the front side of the interposer may be formed using Cu BEOL "Fan-In" wiring on the front side of the interposer. The interposer may have Cu BEOL "Fan-Out" wiring on the backside of the interposer (not shown), with connectivity between the front side and backside enabled through one or more Cu TSVs 443, 483 and connectivity from the interposer to a packaging substrate via one or more solder bumps 444, 484. The examples shown in FIG. 4A and FIG. 4B represents a wiring-only passive interposer design in which the interposer would have to be redesigned or replaced if one of the die is exchanged with a new die or a change in interconnection between die occurs.

Figures 5A, 5B, 5C:
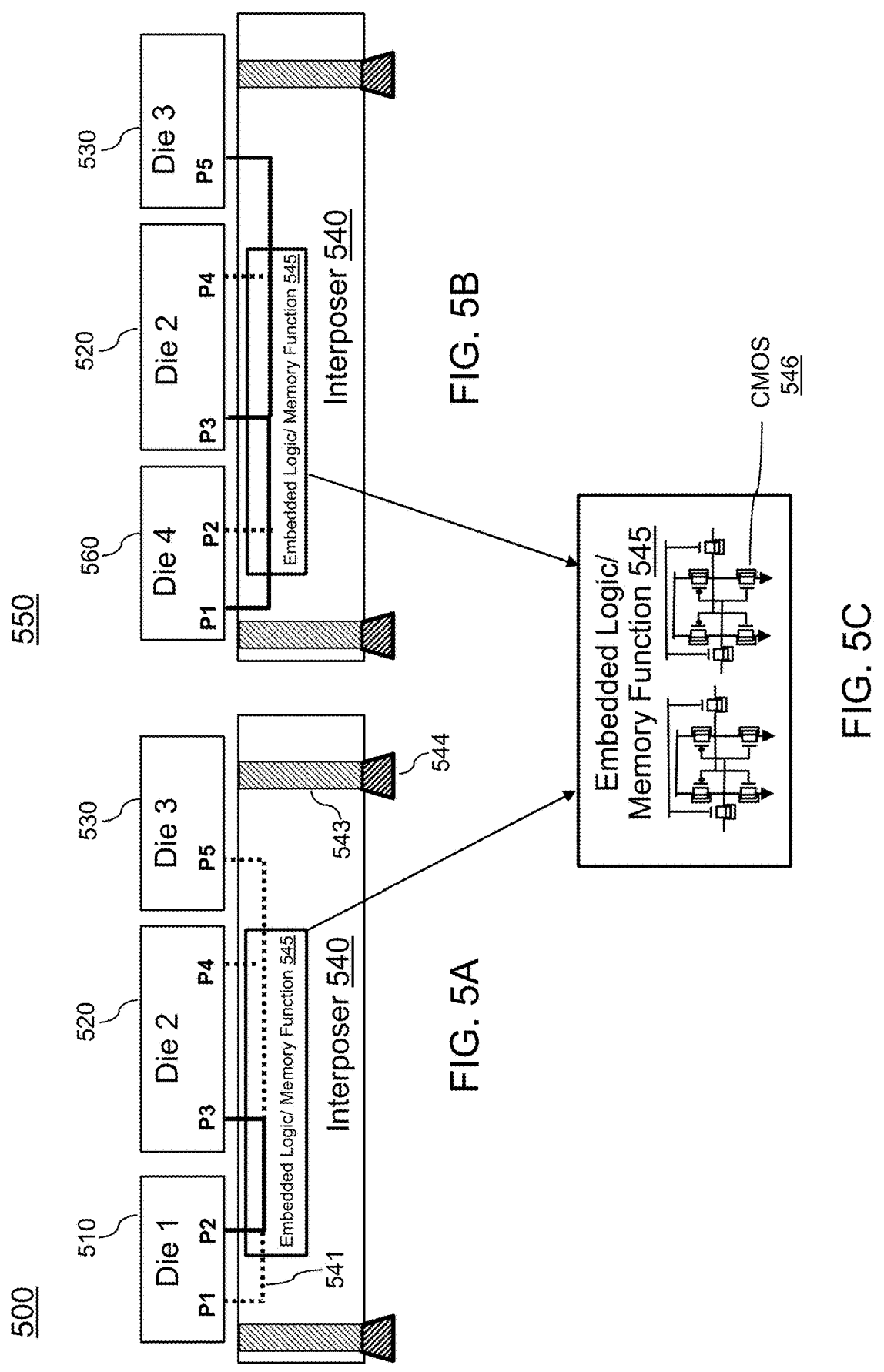
FIG. 5A to FIG. 5C are diagrams of an interposer, in accordance with an embodiment.

FIG. 5A to FIG. 5C are diagrams of an interposer 540, in accordance with an embodiment. In contrast to the examples shown in FIG. 4A and FIG. 4B, an IC package may include a plurality of die (e.g., first die 510, second die 520, third die 530, fourth die 560) on an active interposer 540 (e.g., DSFI) including one or more embedded logic/memory functions 545. The logic/memory functions 545 may include one or more CMOS electrically active devices 546 (see FIG. 5C). In some embodiments, the active interposer 540 may include one or more FPGAs that can be programmable to implement the logic/memory functions 545 (e.g., connectivity controls, security controls or memory controls) associated with the corresponding chips (e.g., die 510, 520, 530, 560). In some embodiments, the logic/memory functions 545 scan be implemented using firmware and/or software that can be executable by one or more processors. The one or more CMOS electrically active devices 546 can be configured to connect between any connection points among a plurality of connection points (e.g., first-to-fifth connection points P1-P5). The locations of the plurality of connection points P1-P5 on the active interposer 540 may be predetermined, and the plurality of connection points P1-P5 may be wired on the front side of the interposer via the one or more CMOS electrically active devices 546. The wiring on the front side of the interposer 540 may be formed using Cu BEOL "Fan-In" wiring on the front side of the interposer 540. The interposer may have Cu BEOL "Fan-Out" wiring on the backside of the interposer (not shown), with connectivity between the front side and backside enabled through one or more Cu TSVs 543 and connectivity from the interposer to a packaging substrate via one or more solder bumps 544. In an initial configuration 500, the one or more CMOS electrically active devices 546 of the active interposer 540 are configured such that the first die 510 and the second die 520 are connected via the one or more CMOS electrically active devices 546 between the second connection point P2 and the third connection point P3, and the first connection point P1, the fourth connection point P4 and the fifth connection point P5 are not connected to any other connection points. In a second configuration 550, the first die 510 is replaced/exchanged with the fourth die 560. In the second configuration 550, the same one or more CMOS electrically active devices 546 of the active interposer 540 are configured such that the fourth die 560, the second die 520 and the third die 530 are connected via the one or more CMOS electrically active devices 546 between the first connection point P1, the third connection point P3, and the fifth connection point P5, and the second connection point P2 and the fourth connection point P4 are not connected to any other connection points. As shown in FIG. 5A to FIG. 5C, the same active interposer 540 can be used to adapt new connectivity between die even if one of the die is exchanged with a new die or a change in interconnection between die occurs, thereby avoiding the need to redesign the interposer. In this manner, changes in intellectual property (IP) (e.g., change from the first die $10 to the fourth die 560) and system functionality (e.g., security functionality) can be programmable via the one or more CMOS electrically active devices 546, thereby providing advantage in span of control and security (e.g., via encrypted secure IP and isolation of control functions).

FIG. 6 is a flow diagram showing a process 600 for manufacturing an IC package (e.g., IC package 100, IC package 350) including an active interposer (e.g., interposer 120, interposer 200, interposer 540), in accordance with an embodiment. In some embodiments, the process 600 includes more, fewer, or different steps than shown in FIG. 6. At step 602, one or more integrated circuit (IC) die (e.g., die 1, die 2, die 3 in FIG. 1) hosting one or more circuits may be mounted on an interconnection layer (e.g., interconnection layer 110).

At step 604, an interposer (e.g., interposer 120) may be coupled to the one or more IC die via the interconnection layer (interconnection layer 110). The interposer 120 may be configured to provide one or more security functions to secure the one or more circuits. In some embodiments, the one or more security functions may include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

In some embodiments, the interposer may be formed to include one or more electrically active devices (e.g., CMOS electrically active devices 546). In some embodiments, the one or more IC die may include a first IC die (e.g., CMOS chip 360) hosting a first circuit (e.g., CMOS logic cores 362) and a second IC die (e.g., memory chip 370) hosting a second circuit (e.g., 372). The one or more electrically active devices (e.g., CMOS electrically active devices implementing one or more control functions 392 such as security functions in the active interposer 390) may be configured to secure the first circuit and the second circuit.

In some embodiments, the one or more IC die may include a first IC die (e.g., die 510) and a second IC die (e.g., die 520). The one or more electrically active devices (e.g., CMOS Logic, or High bandwidth memory die or die stacks 546) may be configured to provide a first connection structure with which the first IC die 510 is connected to the second IC 520 through the interposer 540. In response to the first IC die 510 being replaced with a third IC die 560, the one or more electrically active devices 546 may be configured (by an external controller) to provide a second connection structure with which the third IC die 560 is connected to the second IC 520 through the interposer 540.

At step 606, a backside of the interposer (e.g., backside of the interposer 200) may be coupled to one or more backside power delivery networks 240. In some embodiments, a passive layer(s) (e.g., passive layer(s) 102) may be formed to be coupled to a first surface of the one or more IC die (e.g., top surface of die 1, die 2, die 3 in FIG. 1) and to include one or more passive components configured to secure the one or more circuits (e.g., one or more circuits of die 1, die 2, die 3). The interposer 120 may be coupled to a second surface of the one or more IC die (e.g., bottom surface of die 1, die 2, die 3 in FIG. 1) opposite to the first surface.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above-described embodiments, methods, and examples, but by all embodiments and methods within the scope and spirit of the disclosure.

What is claimed is:

1. A system comprising an integrated circuit (IC) package, the IC package comprising:

one or more IC die hosting one or more circuits; and an interposer coupled to the one or more IC die via an interconnection layer, the interposer comprising one or more electrically active devices configured to provide one or more security functions to secure the one or more circuits, wherein the interposer is coupled to a backside power of the IC package, the one or more IC die include a first IC die and a second IC die wherein the one or more electrically active devices are configured to provide a first connection structure with which the first IC die is connected to the second IC through the interposer, and in response to the first IC die being replaced with a third IC die, the one or more electrically active devices are configured to provide a second connection structure with which the third IC die is connected to the second IC through the interposer.

2. The system according to claim 1, comprising:

a passive layer coupled to a first surface of the one or more IC die and including one or more passive components configured to secure the one or more circuits, wherein the interposer is coupled to a second surface of the one or more IC die opposite to the first surface.

3. The system according to claim 1, wherein the one or more IC die include a first IC die hosting a first circuit and a second IC die hosting a second circuit, and one or more electrically active devices are configured to secure the first circuit and the second circuit.

4. The system according to claim 1, wherein the one or more electrically active devices are configured to obfuscate the one or more circuits.

5. The system according to claim 1, wherein the one or more security functions include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

6. The system according to claim 1, wherein the backside power of the IC package includes one or more backside power delivery networks.

7. An interposer of an integrated circuit (IC) package that includes one or more IC die hosting one or more circuits, the interposer comprising:

one or more electrically active devices configured to provide one or more security functions to secure the one or more circuits, wherein the interposer is coupled to a backside power of the IC package, and the interposer is coupled to the one or more IC die via an interconnection layer, wherein the one or more IC die include a first IC die and a second IC die wherein the one or more electrically active devices are configured to provide a first connection structure with which the first IC die is connected to the second IC through the interposer, and in response to the first IC die being replaced with a third IC die, the one or more electrically active devices are configured to provide a second connection structure with which the third IC die is connected to the second IC through the interposer.

8. The interposer according to claim 7, wherein the IC package comprises a passive layer coupled to a first surface of the one or more IC die and including one or more passive components configured to secure the one or more circuits, wherein the interposer is coupled to a second surface of the one or more IC die opposite to the first surface.

9. The interposer according to claim 7, wherein the one or more IC die include a first IC die hosting a first circuit and a second IC die hosting a second circuit, and the one or more electrically active devices are configured to secure the first circuit and the second circuit.

10. The interposer according to claim 7, wherein the one or more electrically active devices are configured to obfuscate the one or more circuits.

11. The interposer according to claim 7, wherein the one or more security functions include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

12. The interposer according to claim 7, wherein the backside power of the IC package includes one or more backside power delivery networks.

13. A method comprising:

mounting, on an interconnection layer, one or more integrated circuit (IC) die hosting one or more circuits forming an interposer to include one or more electrically active devices, coupling the interposer to the one or more IC die via the interconnection layer, the interposer configured to provide one or more security functions to secure the one or more circuits; and coupling a backside of the interposer to one or more backside power delivery networks, wherein the one or more IC die include a first IC die and a second IC die, and the method comprises:

configuring the one or more electrically active devices to provide a first connection structure with which the first IC die is connected to the second IC through the interposer, and in response to the first IC die being replaced with a third IC die, configuring the one or more electrically active devices to provide a second connection structure with which the third IC die is connected to the second IC through the interposer.

14. The method according to claim 13, comprising:

forming a passive layer to be coupled to a first surface of the one or more IC die and to include one or more passive components configured to secure the one or more circuits, wherein the interposer is coupled to a second surface of the one or more IC die opposite to the first surface.

15. The method according to claim 13, wherein the one or more IC die include a first IC die hosting a first circuit and a second IC die hosting a second circuit, and the method comprises configuring the one or more electrically active devices to secure the first circuit and the second circuit.

16. The method according to claim 13, wherein the one or more security functions include at least one of (1) controlling one or more intrusion sensors integrated into the interposer, (2) managing one or more on-board encryption symmetric keys, (3) managing an identifier (ID) and/or key unique to an individual IC, (4) managing an interrogation history stored on a secure server, (5) controlling a built-in friable structure that can destroy a die in response to an attempt of removing the structure, and/or (6) root of trust.

*  *  *  *  *